(12) United States Patent
Edelstein et al.

(10) Patent No.: US 7,405,147 B2
(45) Date of Patent: Jul. 29, 2008

(54) DEVICE AND METHODOLOGY FOR REDUCING EFFECTIVE DIELECTRIC CONSTANT IN SEMICONDUCTOR DEVICES

(75) Inventors: Daniel C. Edelstein, White Plains, NY (US); Matthew E. Colburn, Hopewell Junction, NY (US); Edward C. Cooney, III, Jericho, VT (US); Timothy J. Dalton, Ridgefield, CT (US); John A. Fitzsimmons, Poughkeepsie, NY (US); Jeffrey P. Gambino, Westford, VT (US); Elbert E. Huang, Tarrytown, NY (US); Michael W. Lane, Cortlandt Manor, NY (US); Vincent J. McGahay, Poughkeepsie, NY (US); Lee M. Nicholson, Katonah, NY (US); Satyanarayana V. Nitta, Poughquag, NY (US); Sampath Purushothaman, Yorktown Heights, NY (US); Sujatha Sankaran, Wappingers Falls, NY (US); Thomas M. Shaw, Peekskill, NY (US); Andrew H. Simon, Fishkill, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 10/707,996

(22) Filed: Jan. 30, 2004

(65) Prior Publication Data

US 2005/0167838 A1   Aug. 4, 2005

(51) Int. Cl.
*H01L 21/00* (2006.01)
(52) U.S. Cl. .................. 438/618; 438/623; 438/703

(58) Field of Classification Search ................ 438/618, 438/623, 703
See application file for complete search history.

(56) References Cited

U.S. PATENT DOCUMENTS 6,265,321 B1   7/2001   Chooi et al.

(Continued)

OTHER PUBLICATIONS

V. Arnal, et al., "A Novel SiO$_2$ Air Gap Low K for Copper Dual Damascene Interconnect." Conference Proceedings of the Advanced Metallization Conference 2000, pp. 71-76.

(Continued)

*Primary Examiner*—Laura M Schillinger
(74) *Attorney, Agent, or Firm*—Joseph P. Abate; Greenblum & Bernstein P.L.C.

(57) ABSTRACT

A method for manufacturing a structure includes providing a structure having an insulator layer with at least one interconnect and forming a sub lithographic template mask on the insulator layer. A selective etching step is used for etching the insulator layer through the sub lithographic template mask to form sub lithographic features near the at least one interconnect. A supra lithographic blocking mask may also be utilized. In another aspect, the method includes forming pinch off sections of sub lithographic size formed in a capping layer on the insulator layer. A semiconductor structure includes an insulator layer having at least one interconnect feature and at least one column formed in the insulator layer. A plurality of sub lithographic features formed on a top portion of the insulator layer and communicating with the at least one column is also provided. The plurality of sub lithographic features have a cross section or diameter less than any of the at least one column. A gap may be prohibited from forming on or near scribe lines or vias.

31 Claims, 5 Drawing Sheets

U.S. PATENT DOCUMENTS

| | | | |
|---|---|---|---|
| 6,346,484 | B1 | 2/2002 | Cotte et al. |
| 6,358,813 | B1 * | 3/2002 | Holmes et al. ............. 438/398 |
| 6,451,712 | B1 | 9/2002 | Dalton et al. |
| 6,495,479 | B1 | 12/2002 | Wu et al. |
| 6,506,660 | B2 * | 1/2003 | Holmes et al. ............. 438/398 |
| 6,509,623 | B2 | 1/2003 | Zhao |
| 2002/0016058 | A1 * | 2/2002 | Zhao ......................... 438/619 |
| 2002/0058394 | A1 * | 5/2002 | Holmes et al. ............. 438/398 |
| 2002/0061633 | A1 * | 5/2002 | Marsh ........................ 438/484 |
| 2002/0061646 | A1 | 5/2002 | Kan et al. |
| 2002/0192949 | A1 | 12/2002 | Kan et al. |
| 2003/0073302 | A1 | 4/2003 | Huibers |
| 2005/0167838 | A1 * | 8/2005 | Edelstein et al. ............ 257/758 |
| 2008/0038915 | A1 * | 2/2008 | Edelstein et al. ............ 438/618 |
| 2008/0038923 | A1 * | 2/2008 | Edelstein et al. ............ 438/703 |
| 2008/0093743 | A1 * | 4/2008 | Yang et al. ................. 257/758 |

OTHER PUBLICATIONS

A. P. Li, et al., "Hexagonal Pore Arrays with a 50-420 nm Interpore Distance Formed by Self-Organization in Anodic Alumina." Journal of Applied Physics, vol. 84, No. 11, Dec. 1, 1998, pp. 6023-6026.

O. Jessensky, et al., "Self-Organization Formation of Hexagonal Pore Arrays in Anodic Alumina." Journal of Applied Physics, vol. 72, No. 10, Mar. 9, 1998, pp. 1173-1175.

A. P. Li, et al., "Polycrystalline Nanopre Arrays with Hexagonal Ordering on Aluminum." Journal of Vacuum Science and Technology, vol. 17, No. 4, Jul./Aug. 1999, pp. 1428-1431.

L.G. Gosset, et al., "General Review of Issues and Perspectives for Advanced Copper Interconnections Using Advanced Copper Interconnections Using Air Gaps as Ultra-Low K Material." IEEE 2003, pp. 65-67.

V. Arnal, et al., "Integration of a 3 Level Cu—$SiO_2$ Air Gap Interconnect for Sub 0.1 micron CMOS Technologies." IEEE 2001, pp. 298-300.

C.T. Black, et al., "Integration of Self-Assembled Diblock Copolymers for Semiconductor Capacitor Fabrication." Applied Physics Letters, vol. 79, No. 3, Jul. 16, 2001, pp. 409-411.

Z. Liu, et al., "Metal Nanocrystal Memories—Part I: Device Design and Fabrication." IEEE Transactions on Electron Devices, vol. 49, No. 9, Sep. 2002, pp. 1606-1613.

* cited by examiner

CVD air-gaps possible with non-critical litho
Blockout mask + diblock copolymer resist channel/air gaps via

DEVICE AND METHODOLOGY FOR REDUCING EFFECTIVE DIELECTRIC CONSTANT IN SEMICONDUCTOR DEVICES

BACKGROUND OF INVENTION

The invention generally relates to a semiconductor device and method of manufacture and, more particularly, to a semiconductor device and method of manufacturing sub lithographic features within a dielectric material to reduce the effective dielectric constant of such material.

To fabricate microelectronic semiconductor devices such as an integrated circuit (IC), many different layers of metal and insulation are selectively deposited on a silicon wafer. The insulation layers may be, for example, silicon dioxide, silicon oxynitride, fluorinated silicate glass (FSG) and the like. These insulation layers are deposited between the metal layers, i.e., interlevel dielectric (ILD) layers, and may act as electrical insulation therebetween or serve other known functions. These layers are typically deposited by any well known method such as, for example, plasma enhanced chemical vapor deposition (PECVD), chemical vapor deposition (CVD) or other processes.

The metal layers are interconnected by metallization through vias etched in the intervening insulation layers. Additionally, interconnects are provided separately within the dielectric (insulation) layers. To accomplish this, the stacked layers of metal and insulation undergo photolithographic processing to provide a pattern consistent with a predetermined IC design. By way of example, the top layer of the structure may be covered with a photo resist layer of photo-reactive polymeric material for patterning via a mask. A photolithographic process using either visible or ultraviolet light is then directed through the mask onto the photo resist layer to expose it in the mask pattern. An antireflective coating (ARC) layer may be provided at the top portion of the wafer substrate to minimize reflection of light back to the photo resist layer for more uniform processing. The etching may be performed by anisotropic or isotropic etching as well as wet or dry etching, depending on the physical and chemical characteristics of the materials. Regardless of the fabrication process, to maximize the integration of the device components in very large scale integration (VLSI), it is necessary to increase the density of the components.

Although silicon dioxide material has been used as an insulating material due to its thermal stability and mechanical strength, in recent years it has been found that better device performance may be achieved by using a lower dielectric constant material. By using a lower dielectric constant insulator material, a reduction in the capacitance of the structure can be achieved which, in turn, increases the device speed. However, use of organic low-k dielectric materials such as, for example, SiLK (manufactured by Dow Chemical Co., Midland, Mich.) tend to have lower mechanical strength than conventional dielectric materials such as, for example, silicon oxide. In some applications, it has been found that the following materials, in combination with other materials within a device, have a certain effective dielectric constant, such as, for example: (i) undoped silicon glass (USG) has a K of 4.1 and a $K_{eff}$ of approximately 4.3; (ii) USG and fluorosilicate glass (FSG) (K of 3.6) has bilayer $K_{eff}$ of approximately 3.8; (iii) organo silicate glass (OSG) has a K of 2.9 and has a $K_{eff}$ of approximately 3.0; and (iv) porous-OSG has a K of 2.2 and a bilayer of porous-OSG and OSG has a $K_{eff}$ of approximately 2.4.

By building a device having a low-k dielectric or a hybrid low-k dielectric stack, the large intra-level line-to-line component of wiring capacitive coupling is reduced, thus maximizing the positive benefit of the low-k material while improving the overall robustness and reliability of the finished structure. The hybrid oxide/low-k dielectric stack structure is much more robust than an "all low-k" dielectric stack, which is known to be relatively more susceptible to via resistance degradation or via delamination due to thermal cycle stresses driven by the high CTE (coefficient of thermal expansion) of organic and semiorganic low-k dielectrics. However, the overall strength of the dielectric is considerably reduced at the lower dielectric constants.

Nonetheless, even with the lower dielectric constant materials including, for example, a hybrid oxide/low-k dielectric stack structure, there is still the possibility to improve even further the electrical properties of the device by lowering the effective K ($K_{eff}$) of a multilevel structure or a K of the dielectric material by forming voided channels within the dielectric material between the interconnects and vias. The channels are vacuum filled and have a dielectric constant of about 1. By using such channels, a higher dielectric constant dielectric material, itself, may be used to increase the overall strength of the structure without reducing the electric properties.

In known systems, sub-resolution lithography processes have been used to create such channels. This typically consists of new manufacturing processes and tool sets which add to the overall cost of the fabrication of the semiconductor device. Also, in sub-resolution lithography processes, it is necessary to etch wide troughs in empty spaces which, in turn, cannot be pinched off by ILD PECVD deposition. Additionally, although the channels create low line-line capacitance, there remains a high level-level capacitance for wide lines. This, of course, affects the overall electrical properties of the device. Also, air gaps can occur near the vias from a higher level which creates the risk of plating bath or metal fill at these areas. Lastly, in known processes, there is also the requirement of providing an isotropic etch which may etch underneath the interconnect thus leaving it unsupported or floating and, thus degrading the entire structural and electrical performance of the device.

The present invention is directed to solving these and other problems.

SUMMARY OF INVENTION

In a first aspect of the invention, a method for manufacturing a structure includes providing a structure having an insulator layer with at least one interconnect and forming a sub lithographic template mask on the insulator layer. A selectively etching step is used for etching the insulator layer through the sub lithographic template mask to form sub lithographic features spanning to a sidewall of the at least one interconnect.

In another aspect of the invention, the method includes providing a structure having an insulator layer with a plurality of interconnects and forming a blocking structure on the insulator layer. The method further includes forming a sub lithographic template mask on the blocking structure having sub lithographic features and selectively etching the blocking structure and the insulator layer through the sub lithographic template mask to form sub lithographic features in the insulator layer.

In still another aspect of the invention, a semiconductor structure includes an insulator layer having at least one gap formed in the insulator layer spanning more than a minimum spacing of the interconnects.

DETAILED DESCRIPTION

This invention is directed to a semiconductor device and methods of manufacture for providing channels (or pores) in a dielectric (insulator) material to improve overall device performance. The methods of the invention do not require new manufacturing processes or tool sets nor do they introduce new materials into the final build and further avoid many of the shortcomings of sub-resolution photolithographic processes. Additionally, the methods of the invention are easily adaptable for use with any dielectric material, whether a hybrid structure or a material having a high dielectric constant. The invention, in one aspect, prevents floating interconnects and also, while decreasing the effective dielectric constant, $K_{eff}$, may maintain the low level-level vertical capacitance of the interconnects. The overall device strength may also be maintained using the methods of the invention.

Figure 1:
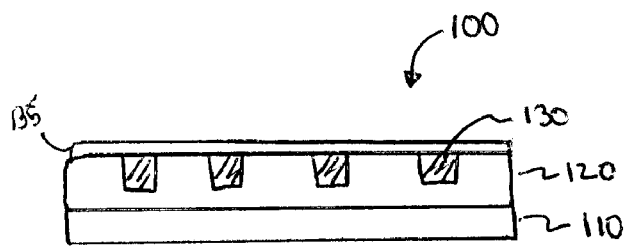
FIG. 1 is representative of a beginning structure used with the invention.

FIG. 1 shows a conventionally manufactured structure used in a semiconductor device. This structure, generally represented as reference numeral 100, is a single level structure, i.e., single wiring layer, shown for illustrative purposes; however, it should be readily understood by those of skill in the art that the structure shown and described herein can be a multilevel structure of several different layers. The methods of manufacturing described herein are equally applicable to such a multilevel structure.

The structure 100 of FIG. 1 includes a substrate 110 of any conventional material such as, for example silicon. The substrate may be an integrated circuit built up to a wiring level. An insulation layer 120 is deposited on the substrate 110 using any known method such as, for example, plasma enhanced chemical vapor deposition (PECVD), chemical vapor deposition (CVD) or other processes. The insulation layer 120 may be, for example: (i) undoped silicon glass (USG), (ii) USG and fluorosilicate glass (FSG), (iii) organo silicate glass (OSG), (iv) porous-OSG and OSG, (v) any combination of these materials or any other known dielectric material. The insulation layer 120, in one implementation, is preferably either OSG or a layered structure of OSG and porous-OSG. One or more interconnects 130 are formed in the insulation layer 120. A diffusion barrier layer 135 which may be SiC, SiN or other known material, as discussed herein, is deposited on the insulation layer 120 to protect the interconnects 130. The diffusion barrier layer 135 may additional act as an etch mask in subsequent processes. The diffusion barrier layer 135 may be at a thickness in the range of 250 Å to 500 Å, or other thicknesses depending on the application.

Figure 2:
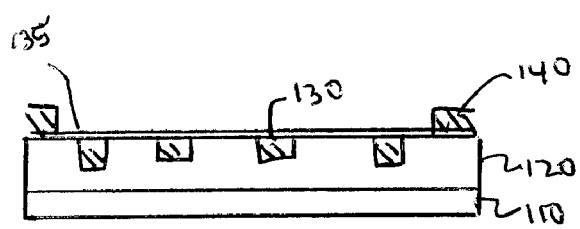
FIG. 2 is representative of a processing step in accordance with the invention.

FIG. 2 is representative of a first step of the method of the invention. In this step, a blockout patterned resist 140 (supra lithographic mask) is deposited or formed on the diffusion barrier layer 135. The blockout patterned resist 140 is, in one implementation 2000 Å to 1 micron in thickness and is deposited in any conventional manner. The blockout patterned resist 140 may be any conventional photoresist material. The blockout patterned resist 140 includes holes or features that are larger than the minimal resolution features; that is, in one implementation, the features of the blockout patterned resist 140 are larger than the spacings between the interconnects 130.

Figure 3:
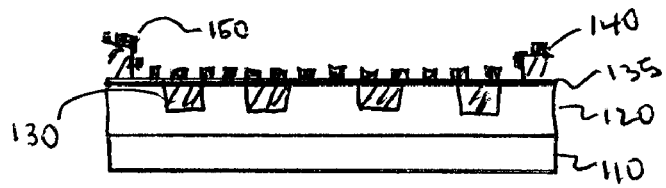
FIG. 3 is representative of a processing step in accordance with the invention.

FIG. 3 is representative of a second step of the invention. In FIG. 3, a block copolymer nanotemplate 150 is formed over the blockout patterned resist 140 and portions of the diffusion barrier layer 135. The block copolymer nanotemplate 150 is a thin layer having features smaller than the minimal resolution features. In other words, the features of the block copolymer nanotemplate 150 are smaller, in one implementation, than the spacings between the interconnects 130. The block copolymer nanotemplate 150 may be a material which self assemblies itself into substantially uniformly shaped and spaced holes or features. For example, the block copolymer nanotemplate 150 may be a self assembled monolayer templated porous or permeable film. The block copolymer nanotemplate 150 may be e-beam, uv or thermally cured. It should be further recognized that in implementations, the blockout pattern resist 140 may instead be formed over the block copolymer nanotemplate 150.

In one implementation, the holes of the block copolymer nanotemplate 150 are about 20 nm in diameter with a spacing of about 20 nm therebetween. In other implementations, the spacings and diameter of the features may range from, for example, below 5 nm to 100 nm. The thickness of the block copolymer nanotemplate 150, in one implementation, is approximately 20 nm and is made from an organic polymer matrix having a mesh of holes. It should be understood, though, that the thickness of the block copolymer nanotemplate 150 (and blockout resist) may vary depending on the thickness of the insulation layer, the required feature resolution and other factors, all of which can be ascertained by one of ordinary skill in the art in view of the description herein.

Figure 4:
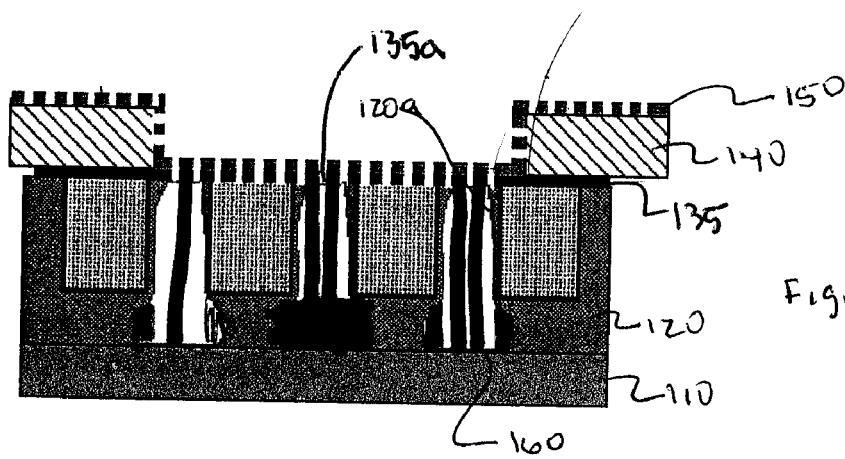
FIG. 4 is representative of a processing step in accordance with the invention.

FIG. 4 shows an etching step of the invention. Now that the block copolymer nanotemplate 150 and the diblock patterned resist 140 are formed on the structure, an etch, in one implementation, using RIE is used to form channels 160 or nano columns between the interconnects 130. In this step, as the insulator 150 is etched between the holes of the block copolymer nanotemplate 150, the insulation layer 120 may be deliberately eroded to form one or more nano column between adjacent interconnects. In some implementations, the insulation layer may be eroded to the substrate or lower layer level. In this step, since no etch process is infinitely selective, the block copolymer nanotemplate 150 may also begin to erode; however, the features of the block copolymer nanotemplate 150 are transferred to the diffusion barrier layer 135, which will then act as the mask having the transferred features. An undercut below the interconnects may also be formed.

As seen in FIG. 4, small holes 135a, i.e., approximately equal to the channels 160, remain at the surface of the insulation material 120, basically corresponding to the size of the features of the block copolymer nanotemplate 150. The holes 135a may be on the order of 20 Å to 200 Å in diameter, for example. Additionally, during etching, insulation material 120a may be etched from the sidewalls of the interconnects 130, but redeposited in further depositing steps. In one implementation, the sidewall material 120a may be in the thickness range between 5 Å and 200 Å, with a thicker portion of the sidewall proximate to the block copolymer nanotemplate 150 or diffusion barrier layer 135. It should be understood by those of skill in the art that the masks 130 and 150, as well as the etching process may be tuned to control the pattern to thus, for example, preclude gaps near via lands and the like. Also, by tuning the etching processes, the channels 160 may extend partially or completely through the insulation layer 120, or the insulation layer near the sidewalls of the interconnects may be completely or substantially completely eroded. In this latter situation, deposition of insulation material near the sidewalls may be provided during a subsequent step of forming a higher interconnect layer.

Figure 5:
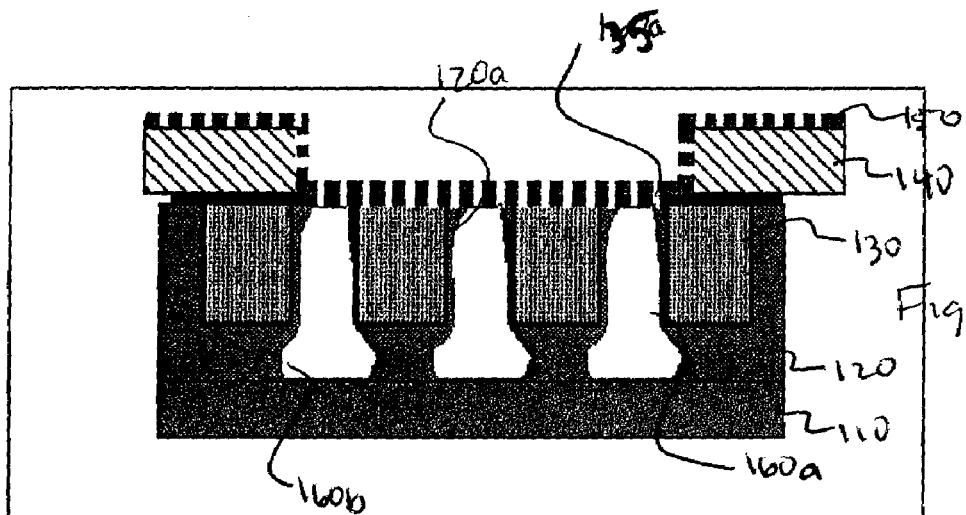
FIG. 5 is representative of a processing step in accordance with the invention.

The RIE, is an anisotropic etch, etching primarily straight down, in order to etch away the insulation to form the channels 160. The RIE etch may be followed by a wet clean process to remove any polymer residue resulting from the etching process. This cleaning chemistry may contain an etchant to continue isotropic etching of the insulation layer to form an undercut below the interconnects (FIG. 5). The etching of insulation layers comprising USG or FSG is relatively slow using dilute hydrofluoric acid (DHF). For example, the etch rate may be 10 Å to 20 Å per minute at a $H_2O:HF$ ratio of 200:1.

On the other hand, OSG has a very low chemical etch rate in DHF, which is almost immeasurable. In OSG implementations, RIE with plasma $O_2$ is used to provide more complete etch capabilities by oxidizing or "damaging" the first skin layer of the exposed OSG. Then, this damaged layer will etch very readily in this DHF. However, when using $O_2$, there is the possibility of damaging the OSG insulation layer or diffusion layer. This damage can be corrected by providing another etch to the damaged portions.

FIG. 5 represents an isotropic etching step to enlarge the nano columns into a single larger column 160a than the original holes of the block copolymer nanotemplate 150, in addition to providing an undercut to the formed channels. In this step, the RIE is changed by adding, for example, $O_2$. In this step, the isotropic etch forms the undercuts 160b, but should not etch away the entire area under the interconnects 130. Again, the etching can be tuned to provide for more extreme undercuts, depending on the desirability of the performance of the overall device; however, the undercut is preferably not performed under the entire area below the interconnects 130. In one implementation, the undercuts will reduce vertical capacitance of wide lines.

Figure 6:
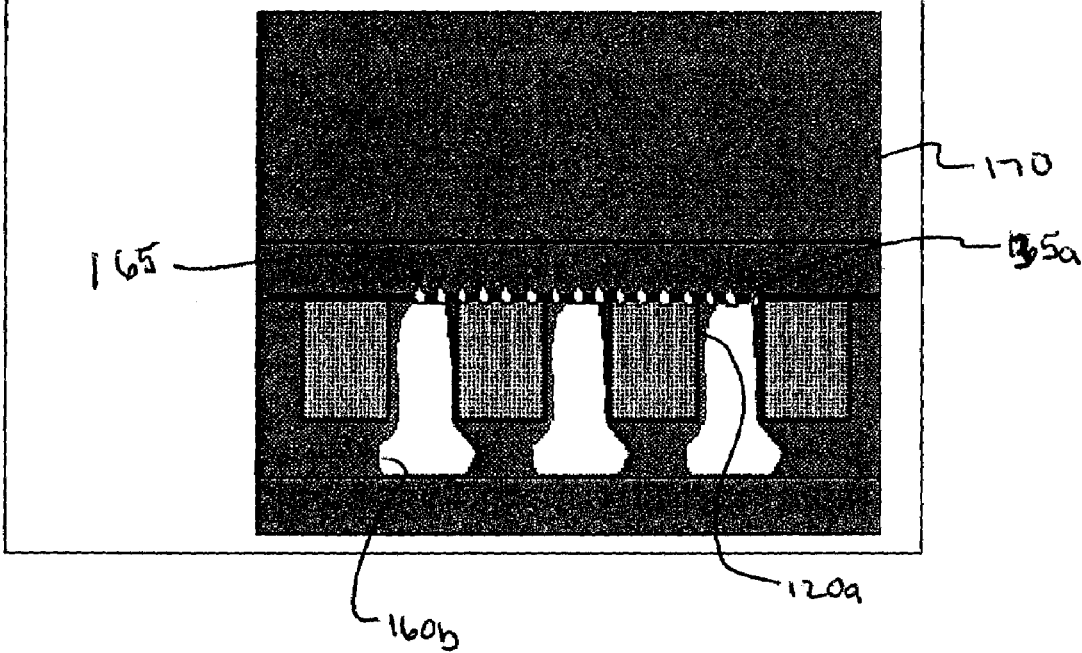
FIG. 6 is representative of processing steps in accordance with the invention (and the formed structure)

FIG. 6 represents other processing steps of the invention. For example, after the undercuts are formed, the block copolymer nanotemplate 150 and the blockout level patterned resist 140 are etched or stripped, leaving behind the small holes 135a. These masks may have already eroded, entirely or partially, during the etching processes, thus leaving the diffusion barrier layer 135 as the mask. A wet etch process can also be performed with solvent, DHF, or other acids to etch away any dielectric material which was previously damaged. In one implementation, the DHF is in a concentration from about 1000:1 to 10:1$H_2O$:HF. In an aspect of the invention, by widening the channels 160, backfill material having a different dielectric constant and other properties, e.g., higher ductability, higher fracture toughness, etc., may be provided within the channels.

Still referring to FIG. 6, a second insulation layer 170 is then deposited on the thus formed structure using any conventional depositing method such as, for example, PEVCD. The second insulation layer 170 may include a cap which will, after little deposition, cover the interconnects 130 (e.g., copper wires) and the diffusion barrier layer 135, as well as forming pinch off areas 135, in addition to sealing the channels. The cap layer will, in embodiments, minimize topography. The pinch off portions 135a may range between, for example, 20 Å to 200 Å, which are sub lithographic features. The pinch offs may act to minimize any level to level capacitance issues between adjacent layers.

During the initial deposition of insulation material, the small size of the holes 135a substantially eliminates significant thickness of material from being deposited within the columns 160. The material for the second layer of insulation layer 170 may be, for example, (i) undoped silicon glass (USG), (ii) USG and fluorosilicate glass (FSG), (iii) organo silicate glass (OSG), (iv) porous-OSG and OSG, (v) any combination of these materials or any other known dielectric material. The insulation layer 170, in one implementation, is preferably either OSG or a layered structure of OSG and porous-OSG, with the OSG acting as the cap for sealing the columns.

Figure 7:
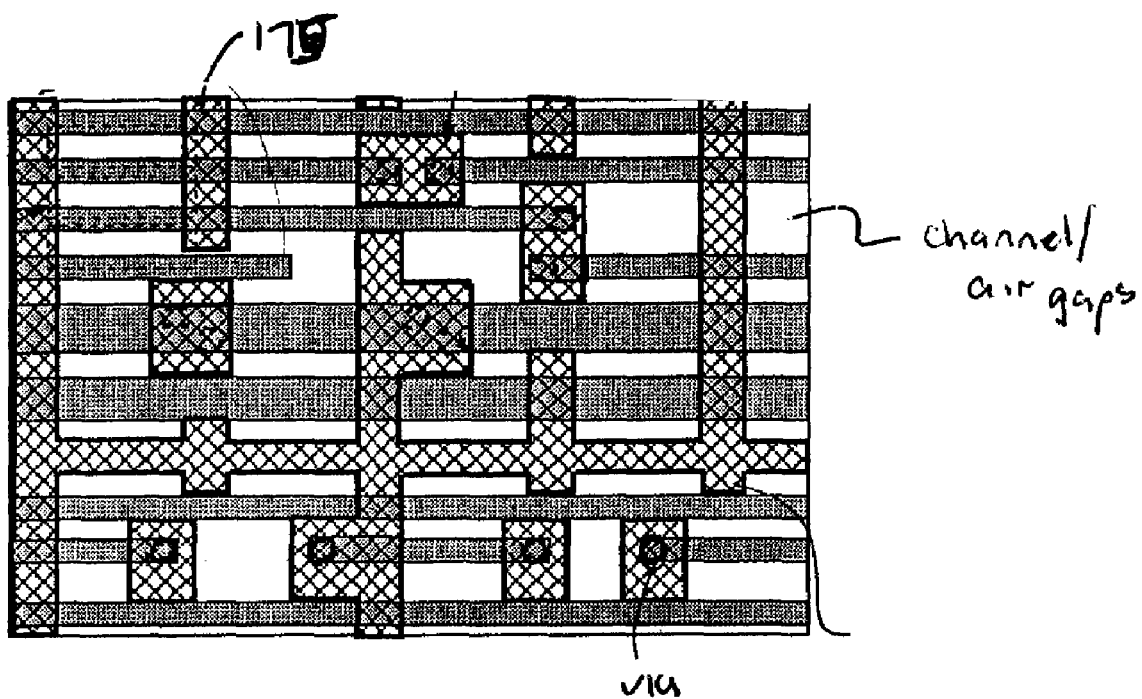
FIG. 7 is a top view of the formed structure in accordance with the invention.
Figure 8:
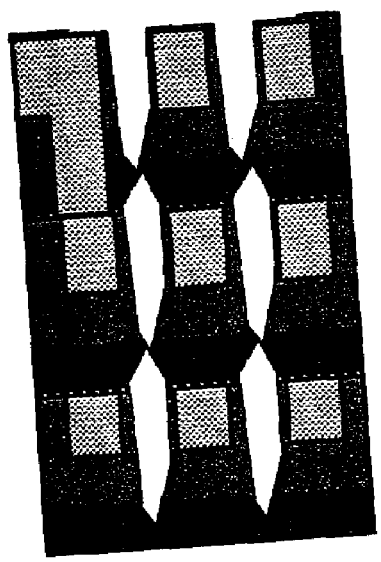
FIG. 8 is a side cut away view of a multilayered structure formed in accordance with the invention.

FIG. 7 shows a top view of the formed structure according to an aspect of the invention. In this view, blockout resist patterns 175 may be formed using the blockout patterned resist 140. The blockout resist patterns 175 may be used to provide additional mechanical reinforcement to the formed structure at locations other than the formed channels. By way of one example, the blockout resist patterns 175 may be formed over the scribe lanes or over the vias to provide additional strength and prevent pores in the vicinity of the sawing operation. It should be recognized that channels in the scribe lane may result in catastrophic failure due to shattering of the fragile material. The blockout resist patterns 175 may also enable dielectric reinforcement with concurrent extreme cutout, and also to avoid or prevent gaps from forming near the via regions.

It should be understood that the steps and structure of the invention, as described above, may be repeated for higher level insulation layers. Thus, as shown in FIG. 7, several insulation layers having vias, interconnects and channels may be formed using the methods of the invention. It should also be understood that by providing the channels, the effective dielectric constant of the insulation materials can be reduced without significantly affecting the integrity, robustness and strength of the entire device. In fact, the methods of the invention can achieve a $K_{eff}$ of less than 2.0 with materials having a $K_{eff}$ of 2.7 or greater. Additionally, by using the method of the invention, porous materials can be avoided for use in the insulation layer thus increasing the mechanical strength and thermal capabilities of the device, i.e., allowing the heat to transfer downward to the substrate. This structure may also be formed by other methods described herein.

Figure 9:
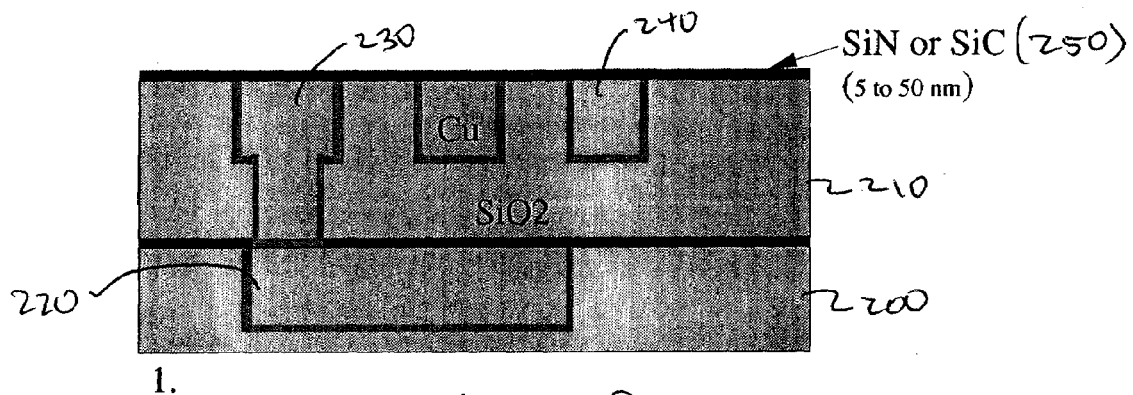
FIG. 9 is representative of a processing step in accordance with the invention.
Figure 10:
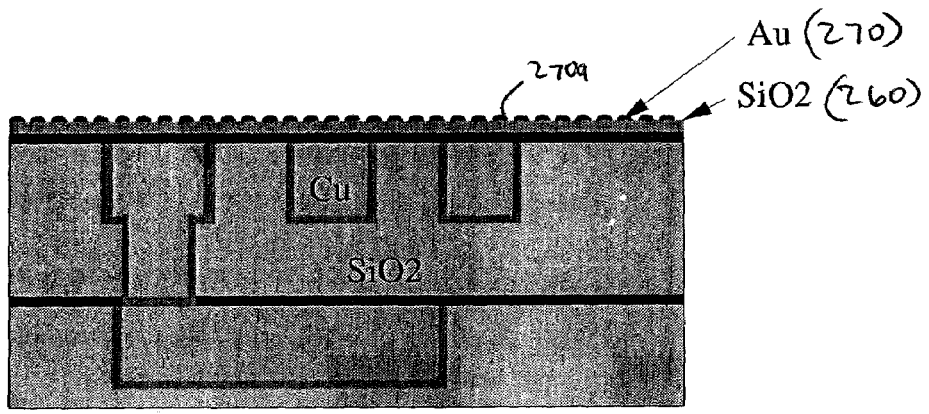
FIG. 10 is representative of a processing step in accordance with the invention.

FIGS. 9 though 14 show another embodiment of the invention. FIG. 9 is representative of a structure having two insulation layers 200 and 210, of any type discussed above. For example, the insulation layer 210 may be $SiO_2$, FSG, SiCOH, SiLK or other materials. The insulation layer 200 includes an interconnect 220 and the insulation layer 210 includes a via 230 and several interconnects 240. A dielectric cap, such as SiN, SiC, SiCOH, etc. (diffusion layer) 250 is deposited over the insulation layer 210 and interconnects. The cap 250 ranges, in one implementation, from 5 nm to 50 nm in thickness. An $SiO_2$ cap may be provided if the interconnect, e.g., copper wire, is capped. Multiple layers of these materials or any combination may also be used with the invention. It should be understood that this same or similar feature is applicable to other embodiments discussed herein.

Referring now to FIGS. 10 through 14, a blanket deposition layer 260 of $SiO_2$ followed by a deposition layer 270 of Au, Ag, In, Sn or Ga in the range from 5 nm to 50 nm is provided on the cap 250. It should be understood that a blockout patterned resist may be deposited between the deposition layers 260 and 270, or alternatively above the deposition layer 270. As in the previous embodiment, the blockout patterned resist should be a supra lithographic mask for preventing the formation of gaps over larger areas of the device. Metals which can easily dissolve in acids, acid salts and alkaline solutions such as Sn or In may be used in the invention in order to provide for easier removal at a later stage; however, other metals are also contemplated for use with this aspect of the invention. The layer 270 is treated, e.g., annealed, to cause agglomeration (i.e., beading) in order to form sub lithographic features in the range of 1 nm to 50 nm. In this manner, nano islands 270a are formed from the layer 270, which act as a mask for further processing steps. The layer 270 is in the range of 1 nm to 50 nm in thickness and, in one implementation, in the range of 5 nm and 20 nm in thickness.

Figure 11:
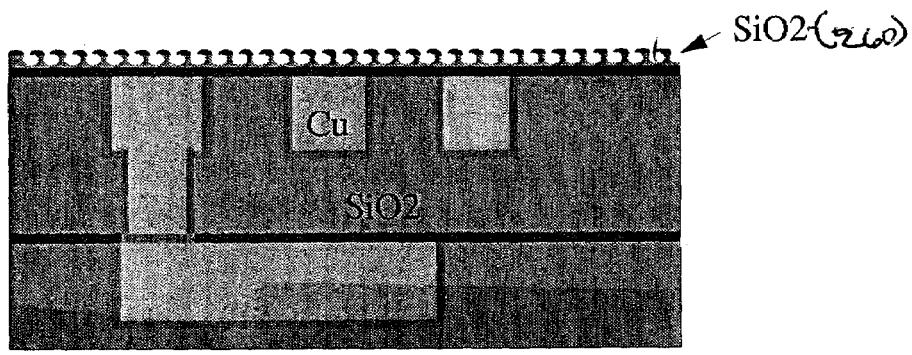
FIG. 11 is representative of a processing step in accordance with the invention.
Figure 12:
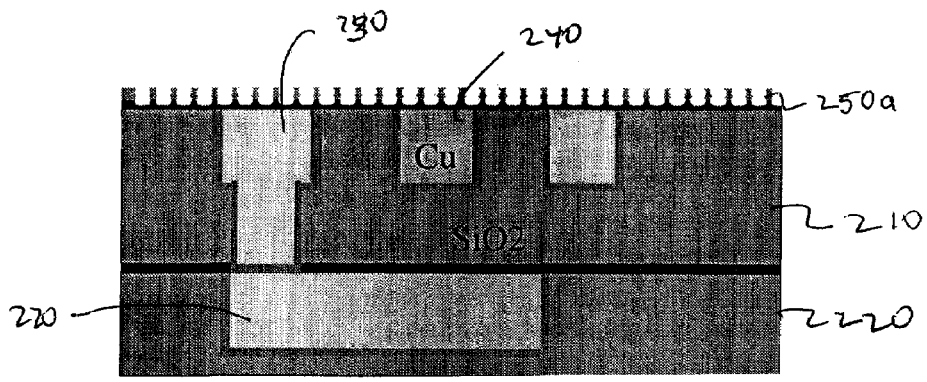
FIG. 12 is representative of a processing step in accordance with the invention.
Figure 13:
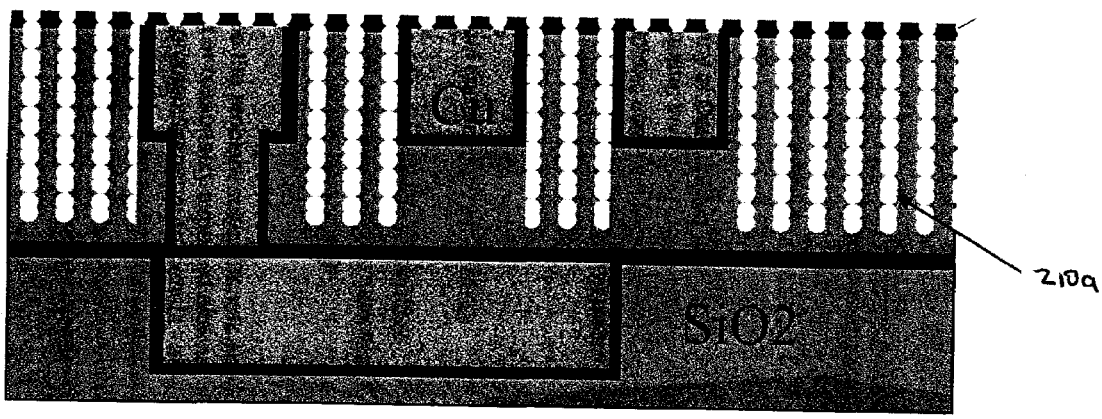
FIG. 13 is representative of a processing step in accordance with the invention.

In FIG. 11, pores are etched in layer 260. This etching may be performed by RIE, in a conventional manner. The metal islands 270a are stripped with a wet or dry etch, and etching continues with RIE into the layer 250. An underlying hardmask may be used to protect the underlying structures during removal of the metal islands 270a such as the cap 250. This RIE etching forms the channels or pores 250a (FIG. 12). Etching continues into the $SiO_2$ layer 210 forming pores or nano channels 210a substantially the same size as the sub lithographic features of layer 270 in the range of 1 nm to 50 nm. The RIE etching is, in one implementation, an anisotropic etch.

Figure 14:
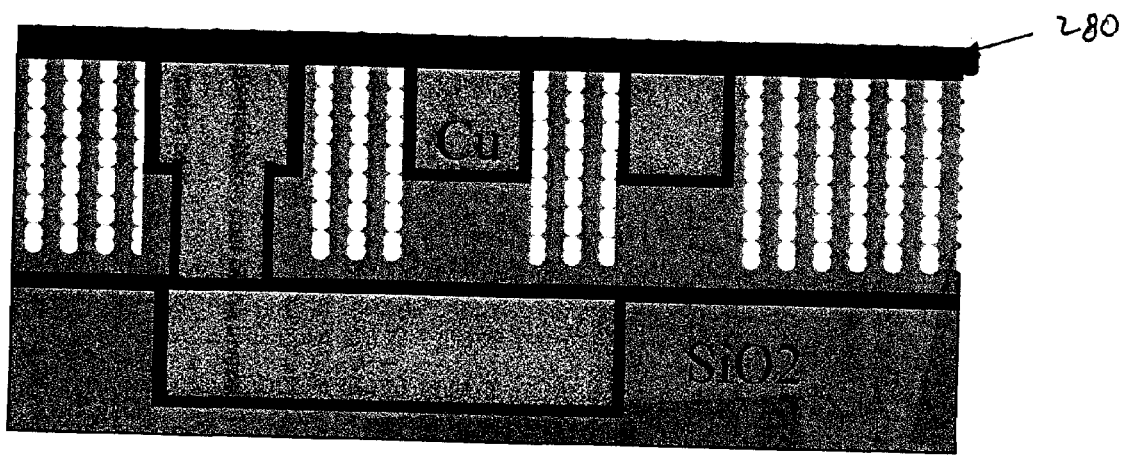
FIG. 14 is representative of a processing step in accordance with the invention (and the formed structure).

An dielectric cap layer 280, such as $SiO_2$, which can be deposited using PECVD or any known method, is deposited on the insulation layer 210 to seal the channels 250a (FIG. 14). The dielectric cap 280 may have a thickness range of 5 nm to 50 nm, in one aspect of the invention. (Of course, other thicknesses, as with all other materials used herein, are also contemplated by the invention.) The dielectric cap 280 may equally be other materials such as SiC, SiCOH or SiN, for example. In one embodiment, the nano channels may be filled with a tough dielectric prior to the sealing with the capping dielectric layer. Pinch off sections may be formed in the capping dielectric layer 280.

In aspects of this embodiment, a random hole pattern in resist may be formed using e-beam, x-ray or EUV lithography. In this case, the resists mask the regions where the dielectric is left behind and the vertical pores or columns are etched into the dielectric. A hardmask such as Nitride may be used underneath the resist if the dielectric is an organic material.

As a further alternative, a random hole pattern in a 2-phase polymer mask with porogen may be utilized to form the pores. To fabricate the mask, the polymer is applied and the porogen is then removed with a high temperature cure or with solvent, as is well known in the art. This will form the sub lithographic holes for further processing. There would be no need for optical lithographic exposure or photomask in this or other processes. The vertical pores or nano columns would then be etched in the manner discussed above.

Alternatively, a spin on film with fine metal particles such as a metal sol may be used to form the required holes, as may be represented by layer 270. In this process, a single layer of fine metal particles from a sol are deposited. This may be performed by pre-treating the layer 260 with a surfactant that forms a monolayer in the surface and attracts the sol particles to the surface to form a layer of the sol particles. That is, the layer would be burned away to leave metal particles on the surface which then could be used for the mask. A phase separable spin on solution such as block copolymer can also be used as the mask. In addition, in this embodiment, selective masking can be used to selectively add toughening to critical areas of the chip, such as discussed with reference to FIG. 7.

While the invention has been described in terms of embodiments, those skilled in the art will recognize that the invention can be practiced with modifications and in the spirit and scope of the appended claims.

The invention claimed is:

1. A method of manufacturing a structure, comprising the steps of:
   providing a structure having an insulator layer with at least one interconnect;
   forming a sub lithographic template mask over the insulator layer; and
   selectively etching the insulator layer through the sub lithographic template mask to form sub lithographic features spanning to a sidewall of the at least one interconnect,
   wherein the sub lithographic features are substantially vertical columns in the insulator layer, and
   wherein the sub lithographic features further include a plurality of holes formed in a capping layer beneath the sub lithographic template mask and having a diameter or cross section less than a diameter or cross section of the at least one interconnect and also substantially equal to the substantially vertical columns in the insulator layer.

2. The method of claim 1, wherein the etching step is an anisotropic etching forming a plurality of the sub lithographic features defined as nano columns.

3. The method of claim 2, wherein the etching step includes an isotropic etching to meld at least adjacent nano columns together and provide an undercut below the at least one interconnect.

4. The method of claim 1, further comprising the step of depositing a capping layer prior to the forming step and pinching off a top portion of the capping layer to form pinched off structures having a sub lithographic diameter.

5. The method of claim 4, further comprising the step of depositing an insulating layer on the portion to form the pinched off structures.

6. The method of claim 5, wherein the depositing step forms insulator material on the sidewalls of the at least one interconnect, which was etched away during the etching step.

7. The method of claim 1, wherein the sub lithographic template mask is a diblock copolymer nanotemplate formed on a diffusion layer, the diffusion layer acting as a mask having features transferred from the diblock copolymer nanotemplate.

8. The method of claim 7, wherein the diblock copolymer nanotemplate has features smaller than spacings between adjacent interconnects.

9. The method of claim 7, wherein the diblock copolymer nanotemplate is a material which self assembles itself into substantially uniformly shaped and spaced holes or features.

10. The method of claim 7, wherein the features of the diblock copolymer nanotemplate 150 are in a range from below 10 nm to 100 nm.

11. The method of claim 7, wherein the diblock copolymer nanotemplate is formed one of (i) partially over a blockout resist over the insulation layer and (ii) below the blockout resist, the blockout resist includes features that are larger than a spacing between adjacent interconnects.

12. The method of claim 11, further comprising the step of removing the block copolymer nanotemplate and blockout resist after the formation of the sub lithographic features in the insulation layer.

13. The method of claim 1, wherein the sub lithographic template mask is a metal deposition layer which is treated to cause agglomeration.

14. The method of claim 13, wherein the metal deposition layer includes a material of one of Au, Ag, In, Sn and Ga.

15. The method of claim 13, wherein the agglomeration is formed by annealing and the agglomeration creates sub lithographic features in the range of 1 nm to 50 nm.

16. The method of claim 15, wherein the annealing causes nano islands which are used as a mask in an etching step.

17. The method of claim 13, wherein the metal deposition layer is deposited over a capping layer.

18. The method of claim 17, wherein the capping layer is formed from material from one of SiN, SiC and SiCOH.

19. The method of claim 17, further comprising the steps of:
etching the capping layer though the sub lithographic features formed in the metal deposition layer to form pores corresponding to the features in the metal deposition layer;
removing the metal deposition layer; and
etching the insulation layer using the capping layer as a mask to form the sub lithographic features.

20. The method of claim 19, wherein the sub lithographic features are substantially vertical pores.

21. The method of claim 20, further comprising melding together adjacent vertical pores between the at least one interconnect.

22. The method of claim 19, wherein the sub lithographic features are backfilled with a second material than that of the insulation layer.

23. The method of claim 19, further comprising the step of providing a sealing cap over the sub lithographic features.

24. The method of claim 1, wherein the sub lithographic features are backfilled with a second material than that of the insulation layer.

25. The method of claim 23, wherein the sealing cap is selected from a material of SiN or SiC having a thickness in the range from 5 nm to 50 nm.

26. The method of claim 23, further comprising the step of depositing an insulator material on the sealing cap layer with a different characteristic.

27. The method of claim 1, wherein the sub lithographic template mask is formed from a random hole pattern in resist using e-beam, x-ray or EUV lithography.

28. The method of claim 1, wherein the sub lithographic template mask is a random hole pattern in a 2-phase polymer mask using a porogen.

29. The method of claim 1, further comprising the step of forming a diblock patterning mask beneath the sub lithographic template mask.

30. The method of claim 1, further comprising providing a supra lithographic mask either over or underneath the sub lithographic template mask.

31. The method of claim 30, wherein the supra lithographic mask prevents formation of gaps over at least one area whose dimensions are larger than a minimum interconnect spacing.

* * * * *